United States Patent
Meunier-Beillard et al.

(10) Patent No.: US 7,910,448 B2
(45) Date of Patent: Mar. 22, 2011

(54) METHOD FOR FABRICATING A MONO-CRYSTALLINE EMITTER

(75) Inventors: Philippe Meunier-Beillard, Kortenberg (BE); Petrus Magnee, Malden (NL)

(73) Assignee: NXP B.V., Eindhoven (NL)

( * ) Notice: Subject to any disclaimer, the term of this patent is extended or adjusted under 35 U.S.C. 154(b) by 397 days.

(21) Appl. No.: 10/586,810

(22) PCT Filed: Jan. 22, 2005

(86) PCT No.: PCT/IB2005/050259
§ 371 (c)(1),
(2), (4) Date: Jul. 21, 2006

(87) PCT Pub. No.: WO2005/071725
PCT Pub. Date: Aug. 4, 2005

(65) Prior Publication Data
US 2009/0075447 A1    Mar. 19, 2009

Related U.S. Application Data

(60) Provisional application No. 60/538,909, filed on Jan. 23, 2004.

(51) Int. Cl.
*H01L 21/331* (2006.01)
(52) U.S. Cl. .. 438/361; 438/309; 438/311; 257/E27.053
(58) Field of Classification Search .......... 438/309–378; 257/E27.053
See application file for complete search history.

(56) References Cited

U.S. PATENT DOCUMENTS

| | | | | |
|---|---|---|---|---|
| 5,506,427 A * | 4/1996 | Imai | ............... | 257/197 |
| 5,614,425 A | 3/1997 | Kimura et al. | | |
| 5,773,350 A | 6/1998 | Herbert et al. | | |
| 6,455,364 B1* | 9/2002 | Asai et al. | ............... | 438/235 |
| 6,482,710 B2* | 11/2002 | Oda et al. | ............... | 438/311 |
| 6,509,242 B2* | 1/2003 | Frei et al. | ............... | 438/312 |
| 7,091,072 B2 | 8/2006 | Park | | |
| 2003/0230779 A1 | 12/2003 | Park | | |
| 2004/0056274 A1* | 3/2004 | Sato et al. | ............... | 257/197 |
| 2005/0079678 A1* | 4/2005 | Verma et al. | ............... | 438/312 |
| 2005/0181569 A1* | 8/2005 | Koshimizu et al. | ........... | 438/312 |

FOREIGN PATENT DOCUMENTS

JP   02 203533   10/1990
JP   02 205033   10/1990

OTHER PUBLICATIONS

Schiz et al., Leakage Current Mechanisms in SiGe HBTs Fabricated Using Selective and NonSelective Epitaxy, Nov. 2001, IEEE Transactions on Electron Devices, col. 48, No. 11, pp. 2492-2493.*

(Continued)

*Primary Examiner* — Asok K Sarkar
*Assistant Examiner* — Julia Slutsker

(57) ABSTRACT

Fabrication of a mono-crystalline emitter using a combination of selective and differential growth modes. The steps include providing a trench (14) formed on a silicon substrate (16) having opposed silicon oxide side walls (12); selectively growing a highly doped mono-crystalline layer (18) on the silicon substrate in the trench; and non-selectively growing a silicon layer (20) over the trench in order to form an amorphous polysilicon layer over the silicon oxide sidewalls.

20 Claims, 2 Drawing Sheets

OTHER PUBLICATIONS

Donker J. J. T. M. : "Vertical Profile Optimisation of a Self-Aligned SiGeC HBT Process With an n-Cap Emitter"; Bipolar/BiCMOS Circuit and Technology Meeting 2003; pp. 111-114.

P. D. Agnello : "Growth Rate Enhancement of Heavy n- and p-Type Doped Silicon Deposited by Atmospheric-Pressure Chemical Vapor Deposition at Low Temperature"; Journal Electrochem Society vol. 140 No. 9; 1993 pp. 2703.

* cited by examiner

US 7,910,448 B2

METHOD FOR FABRICATING A MONO-CRYSTALLINE EMITTER

CROSS REFERENCE TO RELATED APPLICATION

This application claims the benefit of U.S. provisional application Ser. No. 60/538,909 filed Jan. 23, 2004, which is incorporated herein whole by reference.

The present invention relates generally to semiconductor fabrication, and more specifically relates to a method for fabricating a mono-crystalline emitter.

The use of mono-crystalline emitters in bipolar transistor devices has been shown to be an effective structure for reducing parasitic resistance. One of the challenges in forming a mono-crystalline emitter involves providing a highly doped region above the silicon in the active region. In a typical prior art methodology in which an emitter window is formed between two silicon oxide ($SiO_2$) walls on a silicon (Si) substrate, a blanket layer of n-type doped silicon (typically $10^{20}$-$10^{21}$/$cm^3$ of P or As) is placed over the entire trench, and is processed to form: (1) a deposition of amorphous or polysilicon (a-Si) on the oxide field (i.e., on and above the walls of the trench); and (2) a growth of mono-crystalline (c-Si) on the active area (i.e., on the floor of the emitter window).

Unfortunately, this technique has several limitations, including the fact that the thickness of the a-Si layer is linked to the c-Si layer. Accordingly, it is difficult to provide independent control over the thicknesses of the two layers. Furthermore, the dopant incorporation is higher in the a-Si layer than the c-Si layer. These limitations add difficulty to the fabrication of high dopant concentrations in the c-Si layer. Moreover, because growth occurs on the oxide field, some gas phase depression may occur for very small transistors. Finally, salicidation of the c-Si layer may be difficult at the corner of the emitter window.

Accordingly, a need exists for an improved methodology for growing a mono-crystalline emitter.

The present invention addresses the above-mentioned problems, as well as others, by providing a methodology for growing a mono-crystalline emitter using a combination of selective and differential growth modes. In a first aspect, the invention provides a method for growing a mono-crystalline emitter for a bipolar transistor, comprising: providing a trench formed on a silicon substrate having opposed silicon oxide sidewalls; selectively growing a highly doped mono-crystalline layer on the silicon substrate in the trench; and non-selectively growing a silicon layer over the trench in order to form an amorphous or polysilicon layer over the silicon oxide sidewalls.

In a second aspect, the invention provides a method for forming a highly n-type doped layer in a semiconductor wafer, comprising: providing a first active region comprised of a silicon substrate; providing a second region comprised of silicon oxide; selectively growing a highly doped mono-crystalline layer on the silicon substrate; and non-selectively growing a second silicon layer over the silicon substrate and silicon oxide to form an amorphous or polysilicon layer over the silicon oxide.

In a third aspect, the invention provides a method for growing a mono-crystalline emitter for a bipolar transistor, comprising: providing a trench formed on a substrate having opposed silicon oxide side walls; growing a highly doped layer on the substrate in the trench using selective epitaxial growth (SEG); and growing a second layer over the trench using differential epitaxial growth (DEG) in order to form an amorphous or polysilicon layer over the silicon oxide sidewalls.

These and other features of this invention will be more readily understood from the following detailed description of the various aspects of the invention taken in conjunction with the accompanying drawings in which.

The embodiments described herein are directed to a process of forming an n-type emitter of a npn heterojunction bipolar transistor (HBT). However, it should be understood that the invention could also be applied to any fabrication process involving laying down a highly n-type doped layer employing selective epitaxial growth (SEG), using for instance phosphorous (P) or arsenic (As). In addition, the invention could also be applied to p-type doping, e.g., using boron (B) for pnp-bipolar transistors.

Figure 1:
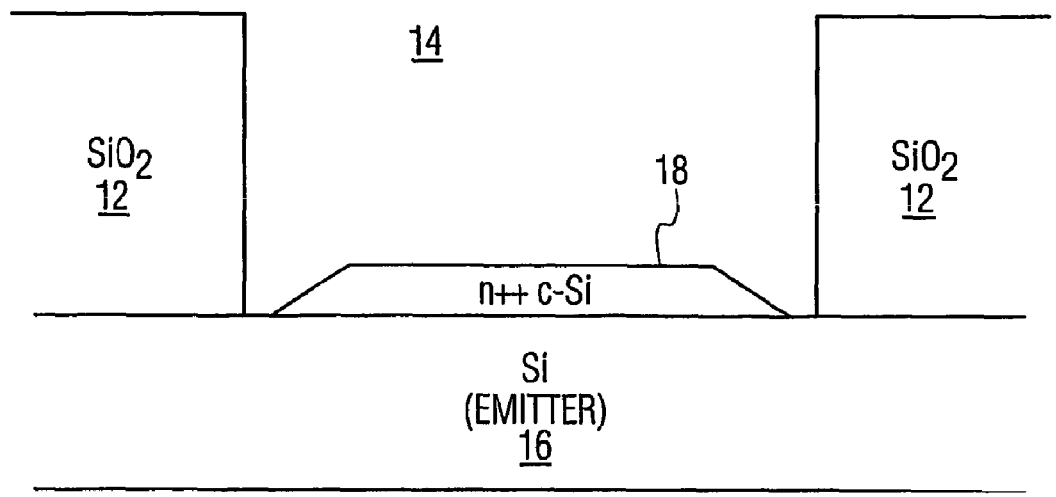
FIG. 1 depicts a first step of applying a highly doped mono-crystalline silicon layer to form an emitter in accordance with the present invention.

Referring now to the drawings, FIG. 1 depicts a first step of forming an emitter. It is assumed that the reader has a general understanding of semiconductor processing, and more specifically, emitter processing in SiGeC heterojunction bipolar transistors. Accordingly, a detailed description of the processing steps is not provided. Such a process is explained for instance in an article by Donkers, Magnee, et al., entitled "Vertical Profile Optimisation of a Self-Aligned SiGeC HBT Process with an n-Cap Emitter," Bipolar/BiCMOS Circuit and Technology Meeting 2003, p. 111-114, which is hereby incorporated by reference. As can be seen in FIG. 1, the emitter is fabricated in an emitter window 14 formed between a pair of silicon oxide $SiO_2$ sidewalls, or field oxide 12, and on top of a silicon substrate 16. The first step is to selectively grow a highly doped mono-crystalline (c-Si) silicon layer 18 in a region substantially limited to the bottom surface of the trench (i.e., the active region).

The highly doped mono-crystalline (c-Si) silicon layer 18 is fabricated with a selective epitaxial growth (SEG) process, as is readily known in the art. For instance, in the article by P. D. Agnello, T. O. Sedgwick and J. Cotte, "Growth rate enhancement of heavy n- and p-type doped silicon deposited by atmospheric-pressure chemical vapor deposition at low temperature," J. Electrochem. Soc. Vol. 140, No. 9 (1993), p. 2703, which is hereby incorporated by reference, it was shown that low temperature epitaxy with dichlorosilane (DCS) and hydrogen as carrier gases leads to a very high dopant concentration. Experiments have verified these teachings, and have further determined that the growth conditions were "selective" to oxide. Thus, it is possible to grow a thin (e.g., <50 nm) c-Si layer 18 without too much nucleation on the field oxide 12.

Note that the growth of layer 18 does not need to be perfectly selective. For example, if in step 1 some island formation of a-Si occurs on the field oxide 12, this will not influence the dopant depression in the c-Si layer 18. It is unlikely to have significant "dopant depression" due to surface mobility. When a-Si or poly-Si is grown on oxide, the dopant (and also various silicon based species) in the gas phase will have to go into the a-Si layer on the field oxide and on into the c-Si. Usually (depending on growth conditions) the growth rate and the dopant incorporation are higher in a-Si than in c-Si. The dopants in the gas phase will then prefer to go into the a-Si layer than into the c-Si layer, which will result in "dopant depression" (in the gas phase). This would be clearly evident if the trench was filled-in completely (i.e., a void formation), and it is a "standard" problem in CVD filling related processes. This effect is expected to be more pronounced when the width of the trench becomes smaller (i.e., having a height/width ratio of the trench typical for small transistors). Accordingly, this type of pseudo-selective growth is well suited for making a mono-crystalline emitter in the emitter window of small transistors. Moreover, because no growth occurs on the field oxide 12, the selective growth operation does not suffer from a gas phase depression.

Note also that perfect crystallinity of layer 18 is not an absolute requirement. Namely, the mono-crystalline emitter can have significant defects, such that it would be difficult to distinguish between mono-crystalline and something akin to poly-crystalline (i.e., a structure with large grains). This situation can occur, for example, under the following circumstances.

(1) Before the epitaxial growth of the mono-emitter, a thin oxide layer has to be removed. This is usually done by using a HF-dip, followed by a hydrogen bake in the deposition tool. The HF-dip will remove the oxide layer and the hydrogen will remove oxygen traces and prepare the Si surface. The epitaxial layer quality is directly linked to the hydrogen bake temperature (and also time). The lower the hydrogen bake temperature, the higher the defect density. In order to keep a "sharp" B spike from forming in the base in the underling HBT structure, a low hydrogen bake temperature is preferred so that defects will be present. Sometimes it happens that the first few nanometers of the layer are crystalline like and because of the high defect density, the layer becomes "poly."

(2) It is also possible to have SEG recipes where amorphous/poly layers could be deposited instead of a mono-crystalline layer. An example is Ge deposition/growth, which is perfectly selective, but presents difficulties when trying to grow a nice crystalline layer. Nonetheless, Ge deposition could be utilized to selectively grow a poly or amorphous layer.

Figure 2:
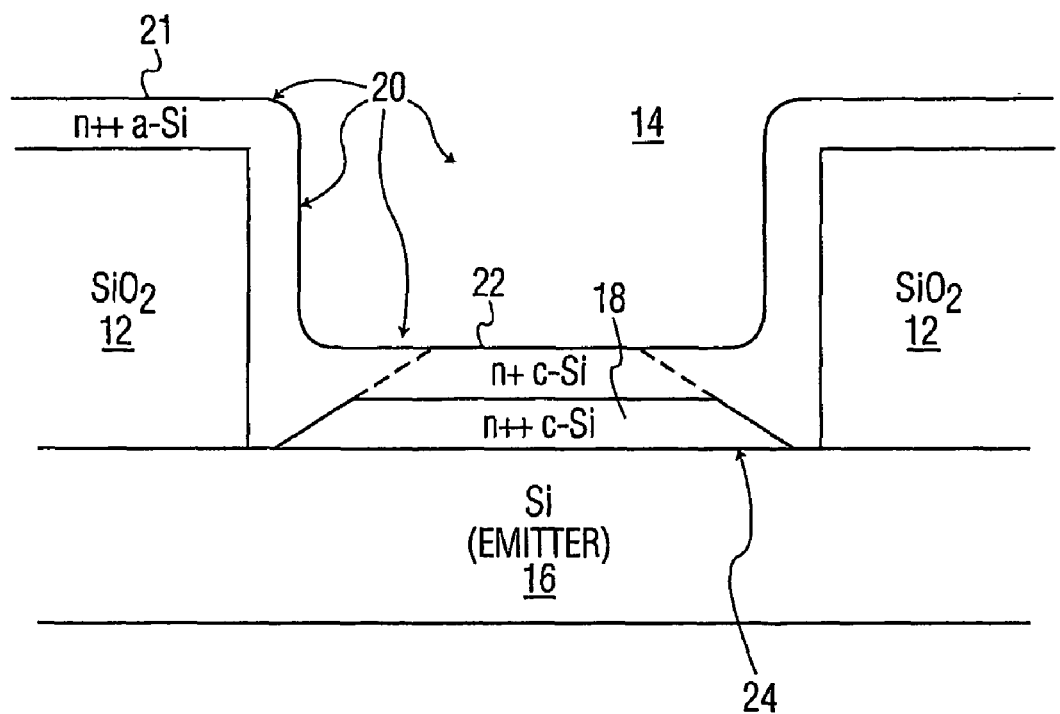
FIG. 2 depicts a second step of applying a second sacrificial silicon layer to form an emitter in accordance with the present invention.

Next, as shown in FIG. 2, a non-selective silicon layer 20 is grown over the entire region in order to form an amorphous or polysilicon (a-Si) layer 21 over the silicon oxide sidewalls. The purpose of this step is to provide silicon on the field oxide 12 in order to make a contact (having for instance about a 25 nm thickness). Note that some of non-selective silicon layer 21 also grows on top of the mono-crystalline silicon layer 18, and forms a second mono-crystalline silicon layer 22 (possibly) having a somewhat lower doping concentration than the selective layer 18. As is indicated by arrow 24, this methodology achieves a higher dopant concentration in the c-Si layer near the corner of the emitter window 14.

The process for growing the non-selective silicon layer 20 is accomplished with a differential epitaxial growth (DEG) technique, as is known in the art. For instance, it can be grown with either a $SiH_4$—$H_2$ system or a $SiH_4$—$N_2$ system. Note that dopant could be added, however it is more important to maintain a smooth silicon layer for salication. The two epitaxial layers 18 and 22 described in the invention can be grown in any known manner. For instance, they may be grown in an ASM-EPSILON™ reactor, which is a single wafer reactor that can be evacuated down to (~10 Torr) for reduced pressure capabilities. However, it should be understood that the invention is not limited to any specific SEG process, reactor type, operating pressure, etc.

In general, to grow a silicon layer, two precursors are typically used: $SiH_2Cl_2$ and $SiH_4$. (Other precursors, such as $SiCl_4$, $SiCl_3$, $Si2H_6$, $Si_3H_8$, etc., could likewise be utilized.) These gasses are diluted, e.g., in $H_2$ or in $N_2$. SiGe or SiGeC (or even silicon carbon Si:C) are also used, and which are important for auger recombination or silicidation. Additionally, it may also be possible to add $GeH_4$ (precursor for Germanium), or $SiH_3CH_3$ (precursor for carbon). Using Cl-based chemistry, possibly even by adding HCl, the ratio of Si-growth and Si-etch can be tuned in such a way that no growth effectively occurs on the field oxide 12, while on the exposed silicon, a layer is grown. This is referred to as selective epitaxial growth. Note also that Cl based chemistry and/or the addition of HCl is not required to implement a selective process. Instead, a selective process can be implemented with $SiH_4$ and $GeH_4$ using hydrogen or nitrogen gas as a carrier (without HCl). To dope the layer with n-type, either $PH_3$ or $AsH_3$ may be added to the gas-flow. Growing at low temperatures helps to incorporate more doping atoms in the layer.

Note that using only $GeH_4$ (with $H_2$ or $N_2$ as carrier gas) is pseudo-selective to oxide. Using only $SiH_4$ (with $H_2$ or $N_2$) is most of the time not selective to oxide (a-Si or poly-Si starts to grow on oxide after the so called incubation time or time needed to make/fabricate the first nucleation on oxide). If $GeH_4$ and $SiH_4$ are combined, the process will be selective to the field oxide 12 depending mainly on the Ge content and on growth conditions. This is essentially the same using DCS+$GeH_4$, except that the process will still be pseudo selective to a lower Ge content compared to $SiH_4$+$GeH_4$.

Switching to a $SiH_4$ based chemistry, the selectivity towards oxide is "lost," and a polycrystalline, or even amorphous, layer will be deposited on the field oxide 12. This growth mode is referred to as non-selective or differential epitaxial growth (DEG).

To summarize, the first step utilizes a pseudo-selective process where all the adatom (and also dopant atoms) on the field oxide 12/side walls will "fall-in" the active area or emitter. The idea is to fill-in the emitter. Because it is (nearly) selective, no growth will occur on the field oxide 12 so that: (i) no competition of dopant incorporation happens between the poly and crystalline layers (because there is no poly or amorphous layer on the field oxide 12; and (ii) only a crystalline layer is grown in the active area.

The second step utilizes a non-selective layer 20 that will grow a polysilicon or amorphous layer on the silicon oxide and on the active area. The growth on the active area may be complex (i.e., the growth rate and dopant concentration will depend on field oxide 12 area and segregation of dopant coming from the first selective layer and the non-selective layer, etc.). The aim of this layer 20 is just to provide enough silicon to make a link between the field oxide 12 and the active region for the salicidation step.

Thus, putting down the a-Si/c-Si layer 21/22 allows the process to be fully compatible with standard state-of-the-art processing for an emitter definition, i.e., POLYEMIT patterning, silicidation, etc. For instance, it would be virtually impossible to make contact to a minimum sized emitter if only the SEG layer 18 existed; a minimum sized emitter would be comparable in size to a contact hole, and any misalignment would then cause the emitter contact to also connect to the base layer next to the emitter.

It should be understood that the mono-crystalline emitter may be formed from SiGe, SiGe:C or Si:C (i.e., during the selective step for auger recombination and/or the non selective step for silicidation). Additionally, carbon may be utilized for SiGe strain compensation and/or diffusion purposes.

Figure 3:
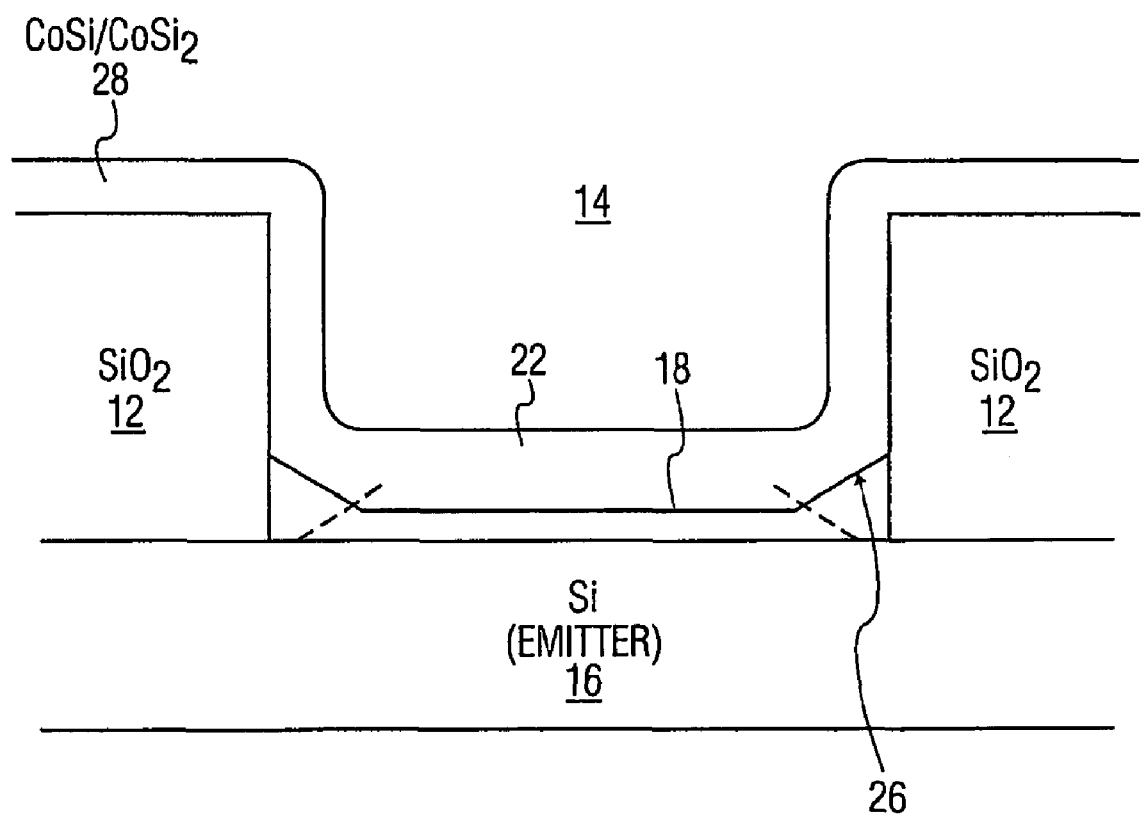
FIG. 3 depicts a salicidation step in accordance with the present invention.

FIG. 3 depicts a further step involving silicidation in which a $CoSi_2$ process is used to salicide the emitter poly. Silicide is commonly used in integrated circuit (IC) processes, both to lower the contact resistance from metal (interconnect) to the silicon, and to lower the in-plane resistance locally at the silicon level, as is well known in the art. Known species used to form silicide include titanium (i.e., Ti, to form $TiSi_2$), cobalt (i.e., Co, to form $CoSi_2$), and even nickel (i.e., Ni, to form NiSi). In the example shown in FIG. 3, Co is utilized.

Assuming a 10 nm layer of Co is deposited, in the case of an unlimited silicon supply, a 35 nm layer of $CoSi_2$ would be formed, consuming roughly 35 nm of Si. This is done in a two-step process, in which first CoSi is formed, and then $CoSi_2$ is formed. Note that if only 25 nm of Si is available (which is the case on the field oxide 12 when a 25 nm layer 21, 22 is deposited), some of the CoSi will not be transformed into $CoSi_2$. The chosen thickness of the layer 21, 22 does not really matters as long as the layer is sufficiently thick that a good silicide (i.e., $CoSi_2$) layer can be formed (e.g., 35 nm in case of 10 nm Co). In the above example wherein selective layer 18 is about 50 nm and non-selective layer 20 is about 25 nm, for the c-Si part 18, 22, a total $CoSi_2$ layer will be formed of 35 nm, leaving 40 nm of c-Si 18. The benefit of choosing the layer 21,22 slightly thinner than required for full $CoSi_2$ formation on the field oxide 12 is to ensure that the silicide is in direct contact with the highly doped c-Si layer 18, which is important for a low ohmic contact.

Thus, as is indicated by arrow 26, the SEG and DEG processes used according to the described methodology control salicidation at the corner of the emitter window.

The foregoing description of the preferred embodiments of the invention has been presented for purposes of illustration and description. They are not intended to be exhaustive or to limit the invention to the precise form disclosed, and obviously many modifications and variations are possible in light of the above teachings. Such modifications and variations that are apparent to a person skilled in the art are intended to be included within the scope of this invention as defined by the accompanying claims.

What is claimed is:

1. A method for growing a mono-crystalline emitter for a bipolar transistor, comprising:
    providing a trench formed on a silicon substrate having opposed silicon oxide side walls;
    selectively growing a highly doped first mono-crystalline layer on the silicon substrate in the trench;
    forming an amorphous or polysilicon layer over the silicon oxide side walls; and
    forming a second mono-crystalline layer over the first mono-crystalline layer;
    wherein the amorphous or polysilicon layer and the second mono-crystalline layer are formed by non-selectively growing a second silicon layer over the trench.

2. The method of claim 1, wherein the step of selectively growing a highly doped first mono-crystalline layer is accomplished using selective epitaxial growth.

3. The method of claim 2, wherein the selective epitaxial growth using a precursor selected from the group consisting of: $SiH_2Cl_2$, $SiH_4$, $SiCl_4$, $SiCl_3$, $Si2H_6$, $Si_3H_8$, $GeH_4$, and $SiH_3CH_3$.

4. The method of claim 1, wherein the step of non-selectively growing the second silicon layer is accomplished using differential epitaxial growth.

5. The method of claim 1, wherein the first mono-crystalline layer is substantially grown only on an active area on the silicon substrate.

6. The method of claim 1, comprising the further step of performing a salicidation process using a silicide selected from the group consisting of: titanium, cobalt and nickel.

7. The method of claim 1, wherein the mono-crystalline emitter is n-type doped with an element selected from the group consisting of: phosphorous and arsenic.

8. A method for forming a highly n-type doped layer in a semiconductor wafer, comprising:
    providing a first active region comprised of a silicon substrate;
    providing a second region comprised of silicon oxide;
    selectively growing a highly doped first mono-crystalline layer on the silicon substrate;
    forming an amorphous or polysilicon layer over the silicon oxide; and
    forming a second mono-crystalline layer over the highly doped mono-crystalline layer;
    wherein the amorphous or polysilicon layer and the second mono-crystalline layer are formed by non-selectively growing a second silicon layer over the first active region and the second region.

9. The method of claim 8, wherein the step of selectively growing a highly doped first mono-crystalline layer is accomplished using selective epitaxial growth.

10. The method of claim 8, wherein the selective epitaxial growth uses a precursor selected from the group consisting of: $SiH_2Cl_2$ and $SiH_4$, $SiCl_4$, $SiCl_3$, $Si2H_6$, $Si_3H_8$, $GeH_4$, and $SiH_3CH_3$.

11. The method of claim 8, wherein the step of non-selectively growing the second silicon layer is accomplished using differential epitaxial growth.

12. The method of claim 8, wherein the first mono-crystalline layer is substantially grown only on the active region.

13. The method of claim 8, comprising the further step of performing a salicidation process using a silicide selected from the group consisting of: titanium, cobalt and nickel.

14. The method of claim 8, wherein the highly n-type doped layer is doped with an element selected from the group consisting of: phosphorous and arsenic.

15. A method for growing a mono-crystalline emitter for a bipolar transistor, comprising:
    providing a trench formed on a substrate having opposed silicon oxide side walls;
    growing a highly doped layer on the substrate in the trench using selective epitaxial growth;
    forming an amorphous or polysilicon layer over the silicon oxide side walls; and
    forming a mono-crystalline layer over the highly doped layer;
    wherein the amorphous or polysilicon layer and the second mono-crystalline layer are formed by growing a second layer over the trench using differential epitaxial growth.

16. The method of claim 15, wherein the selective epitaxial growth using a precursor selected from the group consisting of: $SiH_2Cl_2$, $SiH_4$, $SiCl_4$, $SiCl_3$, $Si2H_6$, $Si_3H_8$, $GeH_4$, and $SiH_3CH_3$.

17. The method of claim 15, wherein the highly doped layer comprises a mono-crystalline layer that is substantially grown only on an active area on the substrate.

18. The method of claim 15, comprising the further step of performing a salicidation process using a silicide selected from the group consisting of: titanium, cobalt and nickel.

19. The method of claim 15, wherein the mono-crystalline emitter is n-type doped with an element selected from the group consisting of: phosphorous and arsenic.

20. The method of claim 15, wherein the mono-crystalline emitter is p-type doped using boron.

* * * * *